(12) United States Patent
Sinha et al.

(10) Patent No.: US 7,394,282 B2
(45) Date of Patent: Jul. 1, 2008

(54) DYNAMIC TRANSMISSION LINE TERMINATION

(75) Inventors: Manoj K. Sinha, Austin, TX (US); Amrish Kontu, Austin, TX (US); Binta M. Patel, Round Rock, TX (US); Gian Gerosa, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 108 days.

(21) Appl. No.: 11/476,949

(22) Filed: Jun. 28, 2006

(65) Prior Publication Data

US 2008/0001621 A1 Jan. 3, 2008

(51) Int. Cl.
*H03K 19/003* (2006.01)
(52) U.S. Cl. .......................................... 326/30; 326/21
(58) Field of Classification Search ...................... 326/30
See application file for complete search history.

(56) References Cited

U.S. PATENT DOCUMENTS

| | | | | |
|---|---|---|---|---|
| 5,023,488 A | * | 6/1991 | Gunning | 326/86 |
| 5,559,447 A | * | 9/1996 | Rees | 326/30 |

OTHER PUBLICATIONS

Kudoh, Junya et al., "A CMOS Gate Array with Dynamic-Termination GTL I/O Circuits", Proceedings of the International Conference on Computer Design: VLSI in computers & Processor (ICCD '95), 1062-6404, © 1995 IEEE, pp. 25-29.

* cited by examiner

*Primary Examiner*—James H Cho
(74) *Attorney, Agent, or Firm*—Buckley, Maschoff & Talwalkar LLC

(57) ABSTRACT

A system may include detection of a low signal received from a transmission line, and uncoupling of a termination circuit from the transmission line in response to the detected low signal. In some aspects, a transition of a strobe signal is then detected, and the termination circuit is coupled to the transmission line in response to the detected transition.

15 Claims, 8 Drawing Sheets

US 7,394,282 B2

DYNAMIC TRANSMISSION LINE TERMINATION

BACKGROUND

Gunning Transceiver Logic (GTL) relates to a type of logic signaling typically used to drive electronic backplane buses. GTL uses smaller voltage swings than used in Transistor-Transistor Logic (TTL) or Complementary Metal Oxide Semiconductor (CMOS) Logic. Moreover, GTL employs symmetric parallel resistive terminations at each end of a signal line to avoid signal wave reflections.

FIG. 1 illustrates conventional GTL system 10 including receiver 11 and transmitter 12. Receiver 11 and transmitter 12 and connected via bus 13, and each terminates bus 13 with resistance 14 that is substantially equal to a resistance exhibited by bus 13. The dotted arrow illustrates a DC current path that exists in a case that transmitter 12 drives a "0". The DC value of this current has been measured at 13 mA for some designs, and exists at each GTL I/O pin. Such power drain is often unsuitable, particularly for mobile systems.

DETAILED DESCRIPTION

Figure 1:
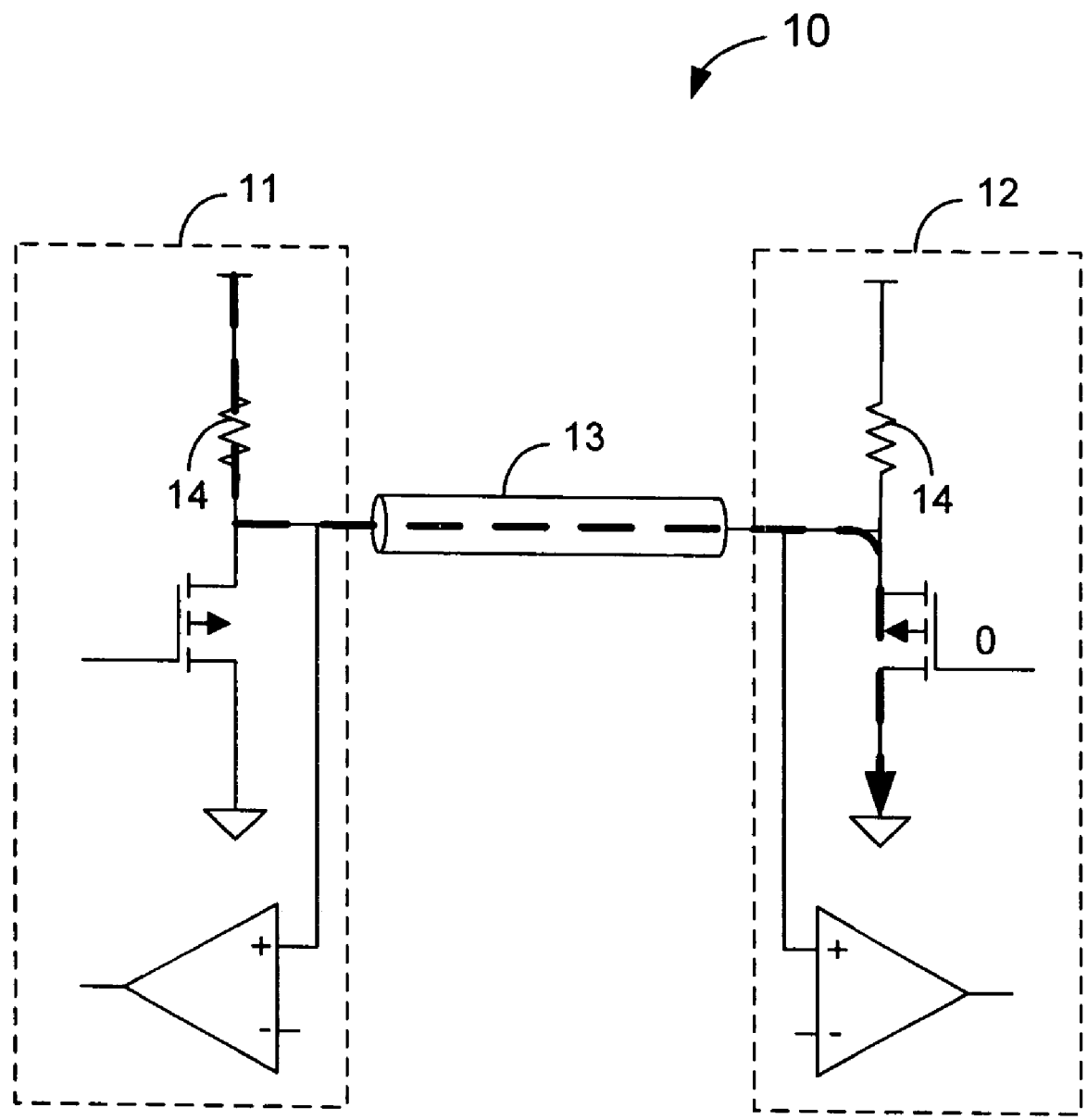
FIG. 1 is a block diagram of a conventional GTI, system according to some embodiments.
Figure 2:
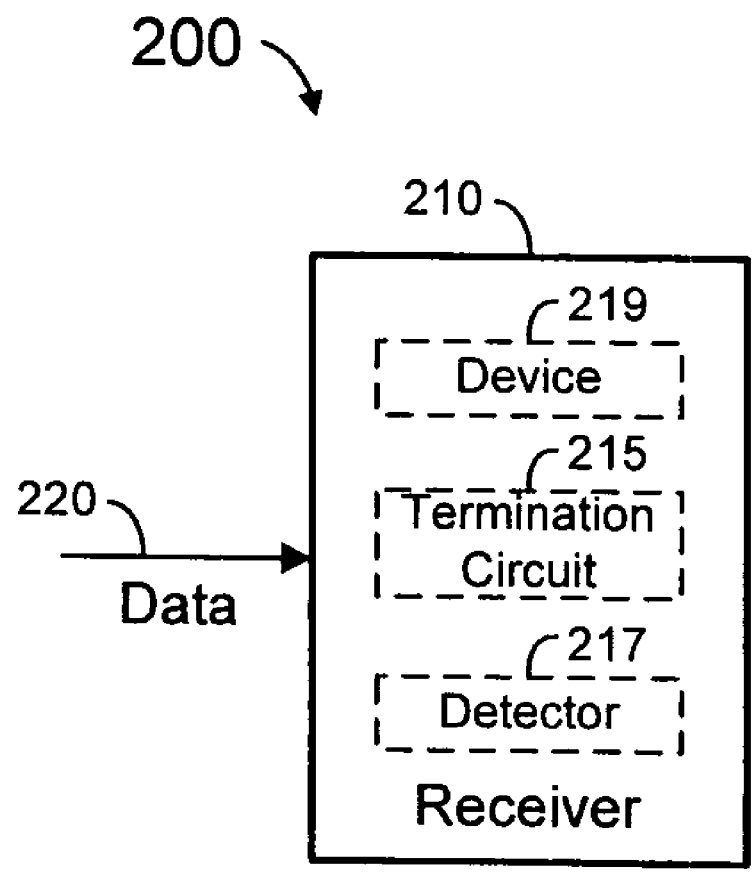
FIG. 2 is a block diagram of an apparatus according to some embodiments.

FIG. 2 is a block diagram of system 200 according to some embodiments. System 200 may comprise an element of any electronic system to receive data. In some embodiments, system 200 is an element of a GTL transceiver within a mobile computing platform.

System 200 includes receiver 210 and transmission line 220 over which receiver 210 receives data. In some embodiments, receiver 210 receives data from two or more transmission lines in a parallel signaling arrangement. According to embodiments supporting bidirectional communication, receiver 210 may operate in conjunction with a transmitter for transmitting data via the transmission lines from which receiver 210 receives data.

Receiver 210 includes termination circuit 215, detector 217 and device 219. Termination circuit 215 terminates transmission line 220. To reduce signal reflections, an impedance of termination circuit 215 may be substantially equal to an impedance of transmission line 220.

Detector 217 may operate to detect a low signal received from transmission line 220. In addition, device 219 may uncouple termination circuit 215 from transmission line 220 in response to the detection of the received low signal. Some embodiments of the foregoing may provide a GTL system with improved power consumption.

Figure 3:
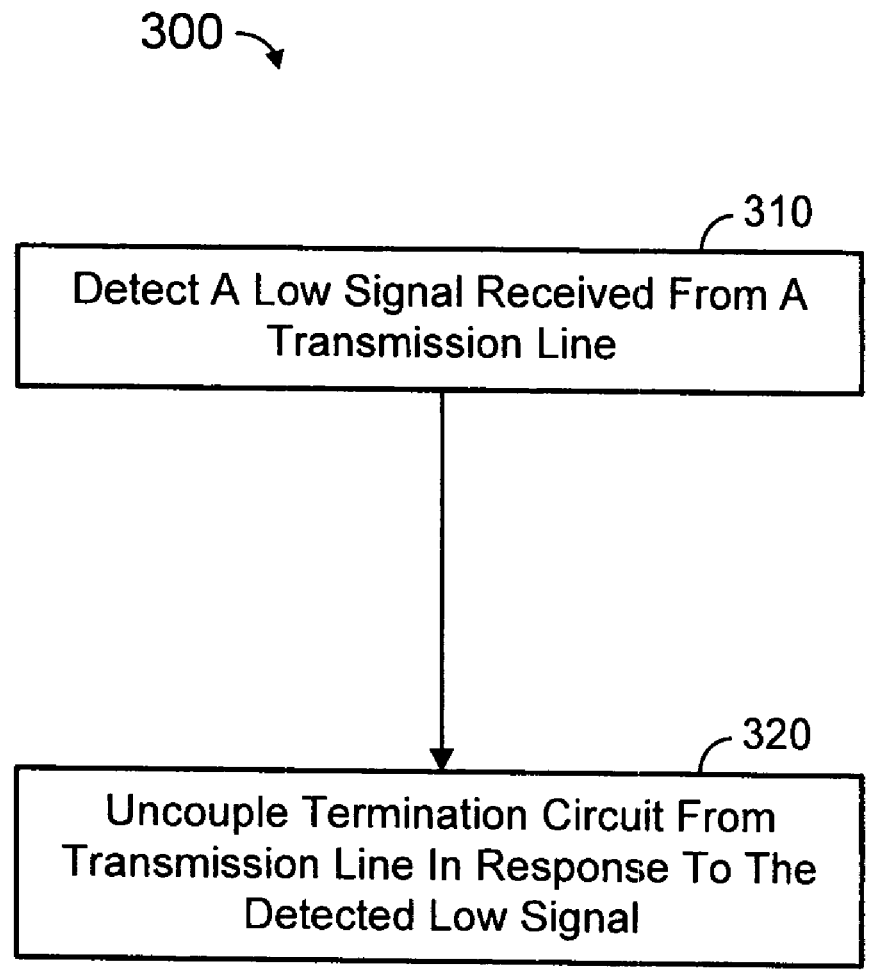
FIG. 3 is a diagram of a process according to some embodiments.

FIG. 3 illustrates process 300 according to some embodiments. Process 300 may be executed by any combination of hardware, software or firmware. In some embodiments, system 200 of FIG. 2 executes process 300.

Initially, a low signal received from a transmission line is detected at 310. Referring to the example of FIG. 2, detector 217 of receiver 210 may detect the low signal from transmission line 220 at 310. Next, and in response to the detected signal, a termination circuit is uncoupled from the transmission line at 320. As described above, device 219 may operate at 320 to uncoupled termination circuit 215 from transmission line 220.

Figure 4:
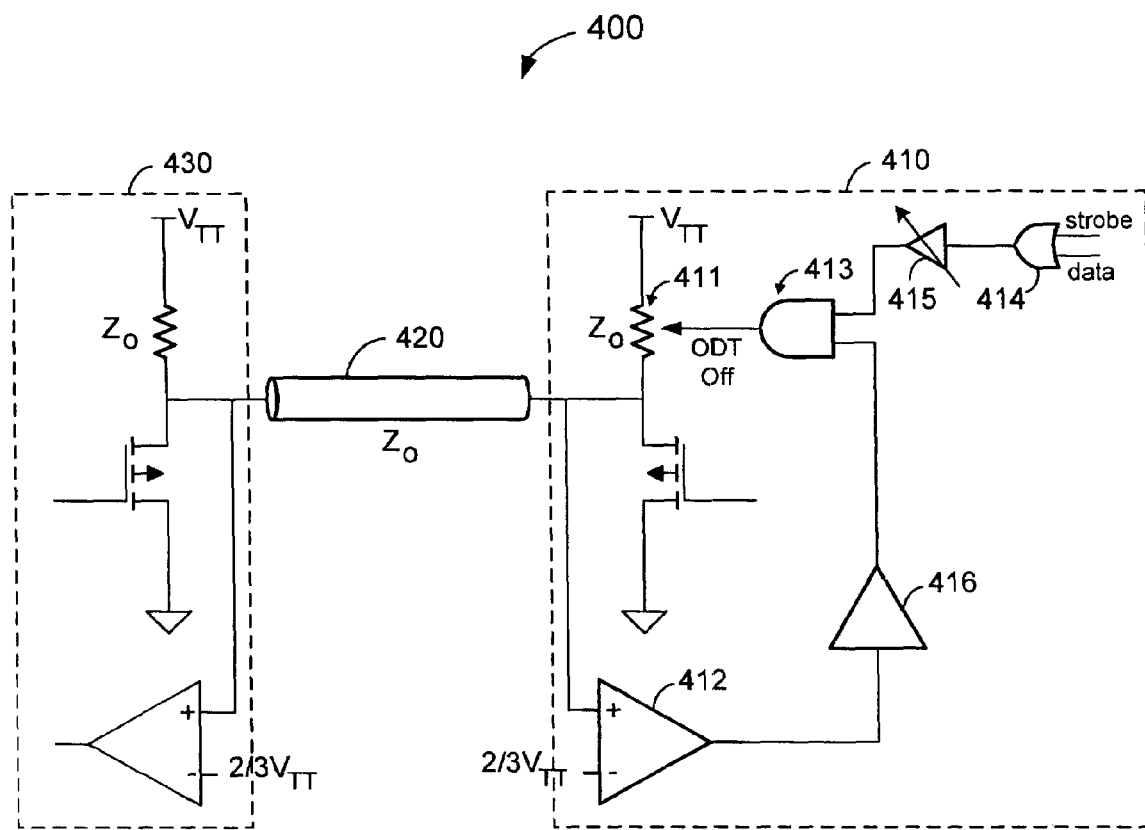
FIG. 4 is a schematic diagram of an apparatus according to some embodiments.

FIG. 4 is a schematic diagram of system 400 according to some embodiments. System 410 comprises transceiver 410, transmission line 420, and conventional GTL transceiver 430. According to some embodiments, one of transceiver 410 and transceiver 430 is an element of a microprocessor and the other is an element of a chipset.

Transceiver 410 comprises termination circuit 411, detector 412, device 413, detector 414, delay element 415 and Schmitt trigger 416. The foregoing elements of transceiver 410 may operate to implement process 200 according to some embodiments. In some embodiments, detector 412 emits a high signal upon detecting a signal from transmission line 420 having a magnitude less than $\frac{2}{3}(V_{TT})$. Schmitt trigger 416 therefore sends a signal to device 413 to uncouple termination circuit 411 from transmission line 420.

According to some embodiments, detector 414 detects a transition of a strobe signal. The strobe signal, as well as the data signal received by detector 414, are incoming signals received over transmission line 420 and therefore present at both transceiver 410 and GTL transceiver 430. In response to the detected transition, device 413 couples termination circuit 411 to transmission line 420 via the On-Die Termination (ODT) off signal. This coupling may occur after a delay period associated with delay element 415.

Figure 5:
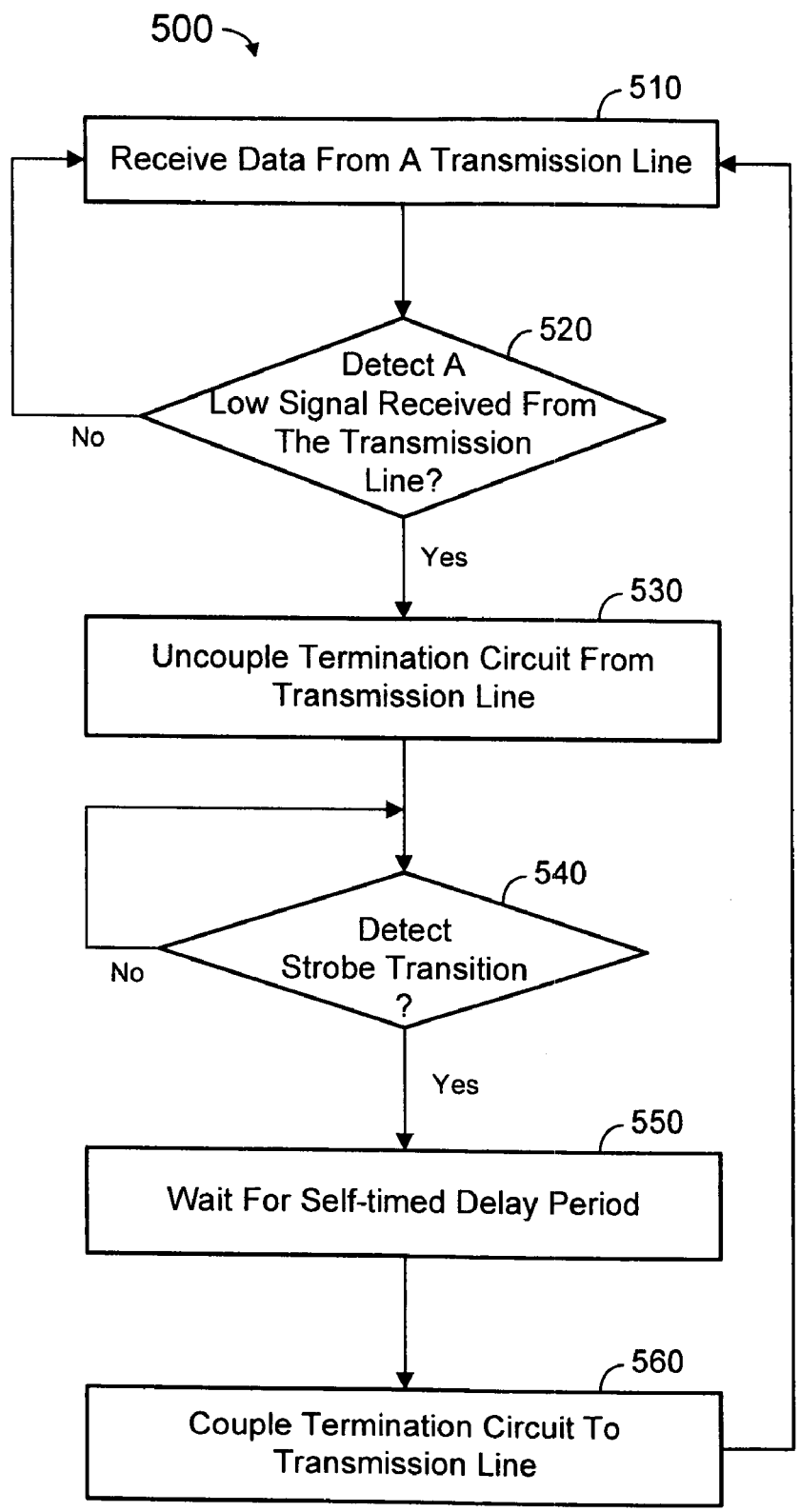
FIG. 5 is a diagram of a process according to some embodiments.

FIG. 5 is a flow diagram of process 500 according to some embodiments. Process 500 may be executed by any combination of hardware, software or firmware, including but not limited to system 200 of FIG. 2 and transceiver 410 of FIG. 4.

Data is received from a transmission line at 510. At 520, it is determined whether a low signal has been received from the transmission line. Referring to FIG. 4, detector 412 may receive the data at 510 and, at 520, may output a low signal if a magnitude of the received data is greater than $\frac{2}{3}(V_{TT})$. Flow cycles between 510 and 520 until, at 520, it is determined that a low signal has been received from transmission line 420. Such a determination may result in detector outputting a high signal.

In response to the detection at 520, a termination circuit is uncoupled from the transmission line at 530. Again turning to transceiver 410, Schmitt trigger 416 and device 413 may operate at 530 to uncoupled termination circuit 411 from transmission line 220. Such uncoupling may comprise creating an open circuit between transmission line 420 and termination circuit 411.

Figure 6:
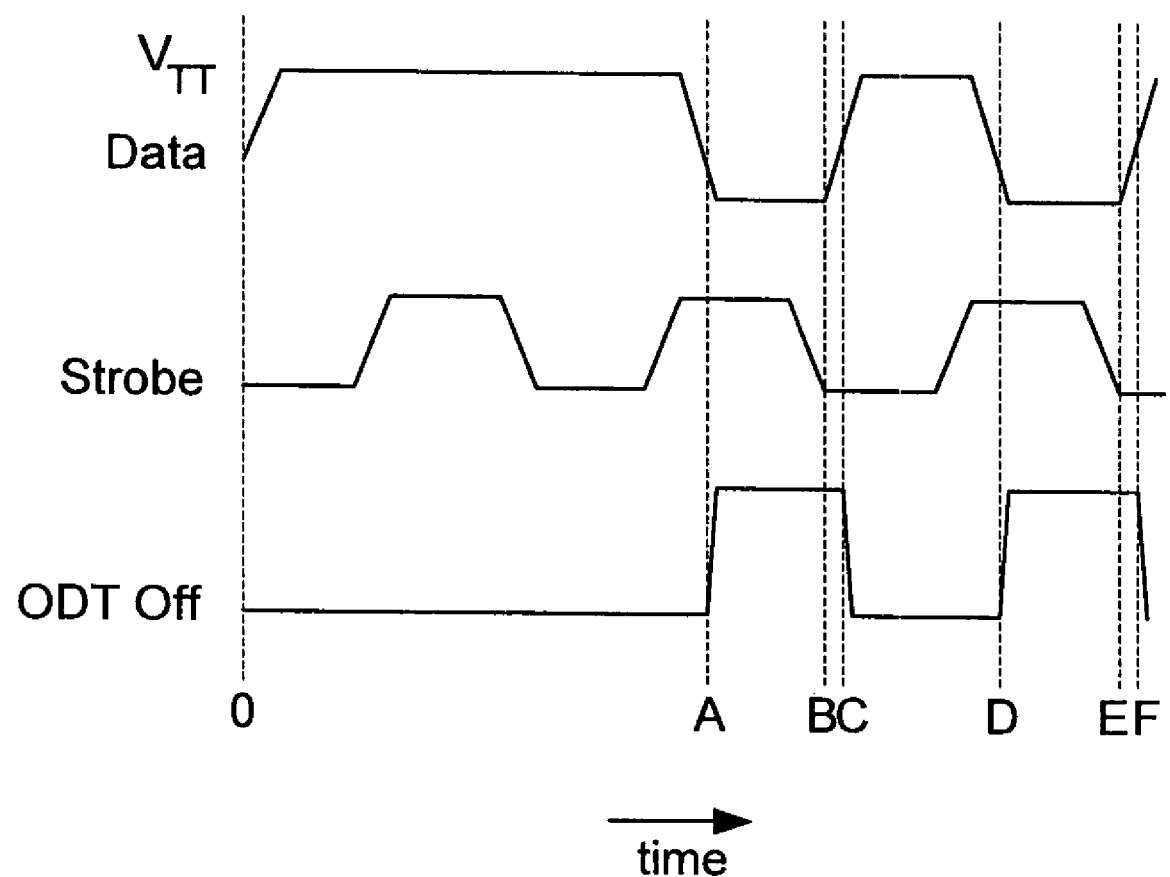
FIG. 6 is a timing diagram according to some embodiments.

FIG. 6 is a timing diagram to illustrate process 500 according to some embodiments. As shown, flow cycles between 510 and 520 between time 0 and time A. During this time, no low signal is detected and the ODT off signal is low (i.e., circuit 411 is coupled to line 420). A low signal is detected at time A and, in response, the ODT signal goes high, thereby uncoupling circuit 411 from line 420.

Returning to process 500, flow pauses at 540 until a transition of the strobe signal is detected. Once the transition is detected (e.g., by detector 414), flow waits for a self-timed delay period (e.g., associated with delay element 415) at 550 and then proceeds to 560. The termination circuit is coupled to the transmission line at 560. Flow then returns to 510 to receive data from the properly terminated transmission line.

FIG. 6 illustrates transition of the strobe signal at time B. The self-timed delay period of 550 then occurs from time B to time C. At time C, the ODT off signal is taken low, causing coupling of the termination circuit to the transmission line. FIG. 6 also shows the events of time A through C repeating from time D through F.

Figure 7:
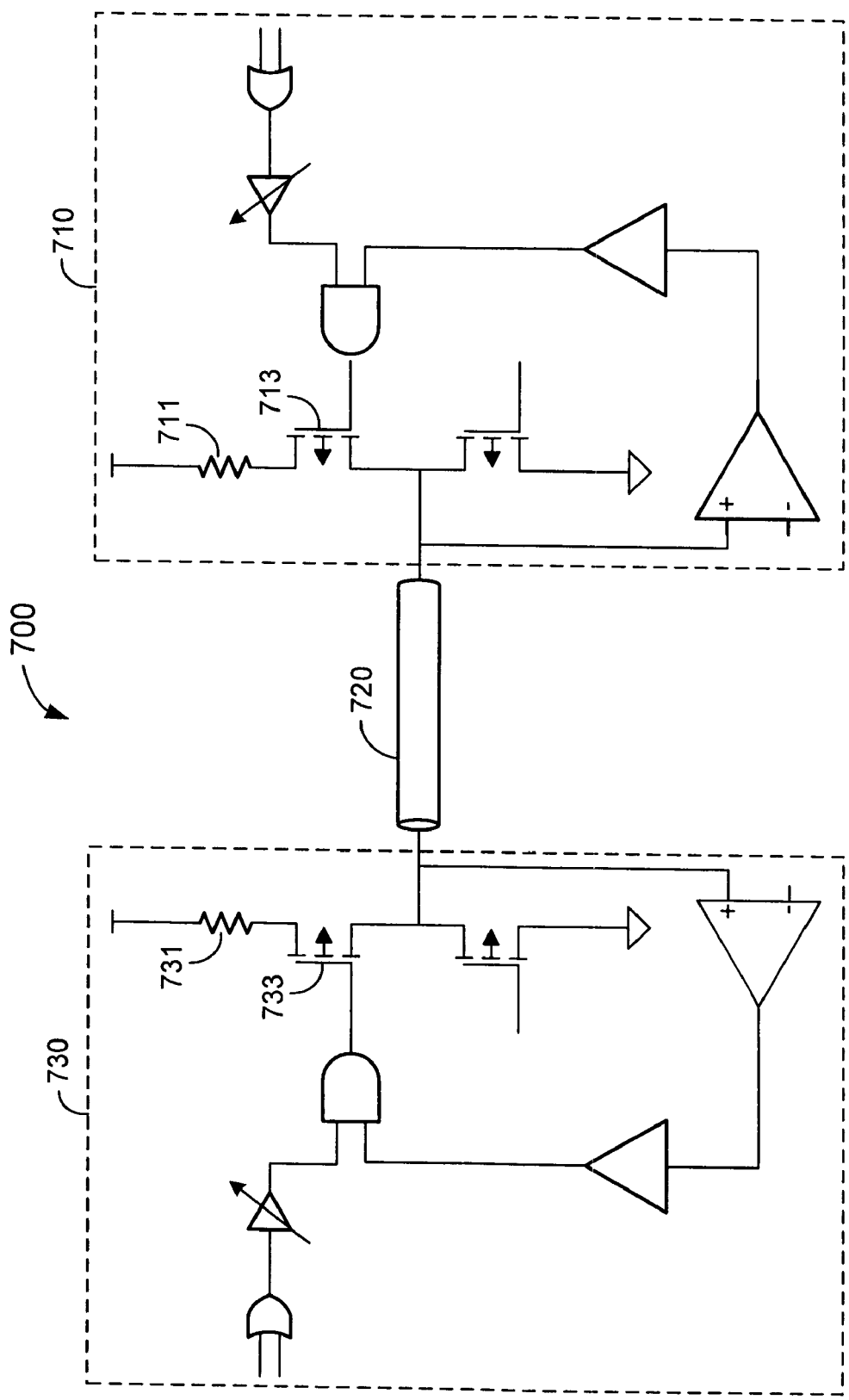
FIG. 7 is a schematic diagram of an apparatus according to some embodiments.

FIG. 7 is a schematic diagram of system 700 according to some embodiments. Transceiver 710 and transceiver 730 of system 700 each embody some of the above-described aspects. In this regard, each of transceiver 710 and transceiver 730 may implement process 200 and/or process 500.

Transceiver 710 includes termination circuit 711 and switch 713, and transceiver 730 includes termination circuit 731 and switch 733. Termination circuit 711 and termination circuit 731 each terminate transmission line 720, and switches 713 and 733 are disposed between transmission line 720 and termination circuits 711 and 731, respectively. Accordingly, switches 713 and 733 may operate to uncouple termination circuits 711 and 731 from transmission line 720 in response to detection of a low signal received from transmission line 720.

Figure 8:
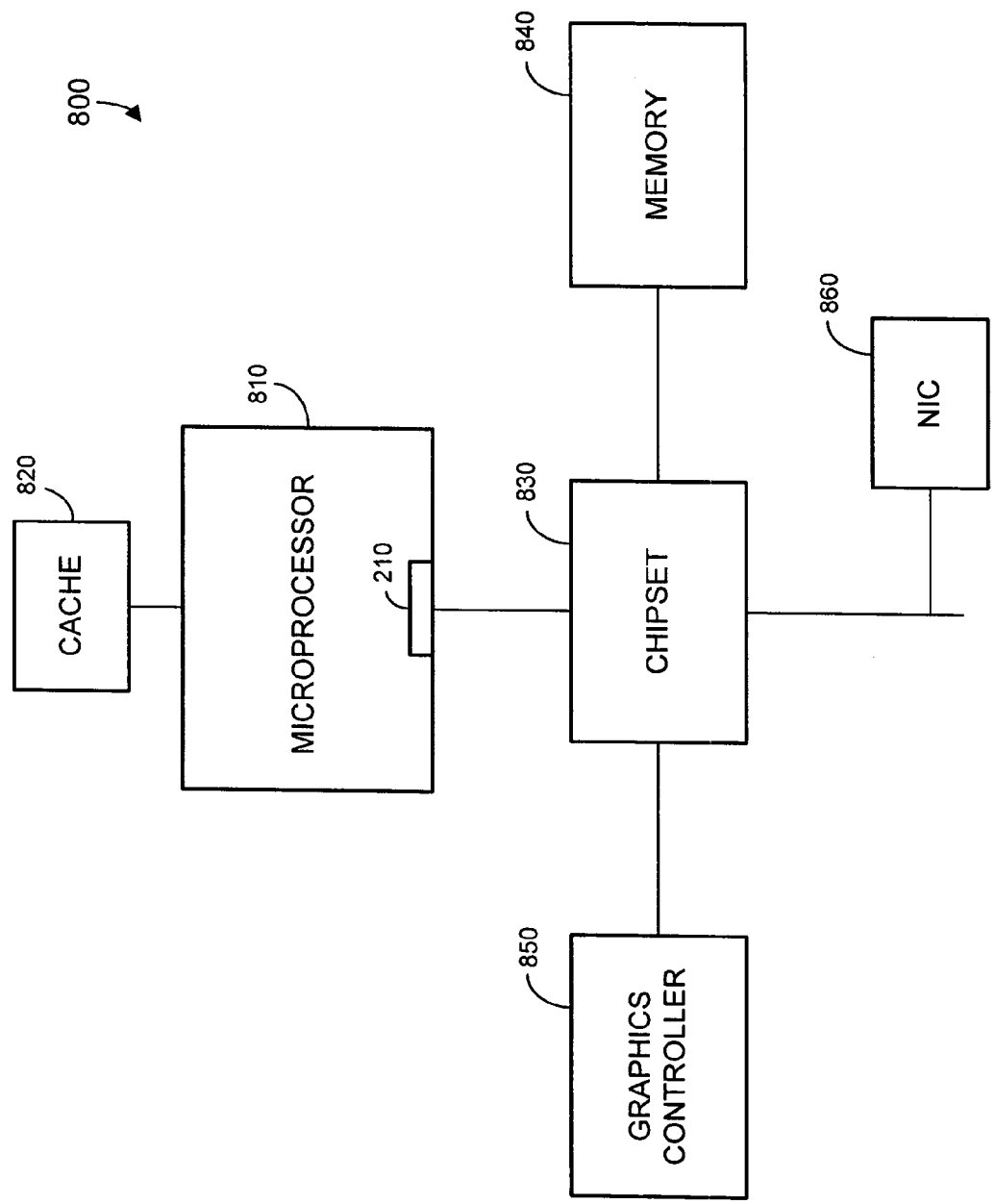
FIG. 8 is a block diagram of a system according to some embodiments.

FIG. 8 illustrates a block diagram of system 800 according to some embodiments. System 800 includes microprocessor 810 comprising receiver 210 of FIG. 2. Microprocessor 810 communicates with off-die cache 820 according to some embodiments.

Microprocessor 810 may communicate with other elements via a host bus and chipset 830. In this regard, chipset 830 may transmit data to receiver 210, which may respond thereto as described above. Chipset 630 also communicates with memory 840, which may comprise any type of memory for storing data, such as a Single Data Rate Random Access Memory, a Double Data Rate Random Access Memory, or a Programmable Read Only Memory. Other functional units, such as graphics controller 850 and Network Interface Controller (NIC) 860, may communicate with microprocessor 810 via appropriate busses or ports.

The several embodiments described herein are solely for the purpose of illustration. Some embodiments may include any currently or hereafter-known versions of the elements described herein. Therefore, persons in the art will recognize from this description that other embodiments may be practiced with various modifications and alterations.

What is claimed is:

1. A method comprising:
    detecting a low signal received from a transmission line; and
    uncoupling a termination circuit from the transmission line in response to the detected low signal;
    wherein the termination circuit exhibits an impedance substantially equal to an impedance of the transmission line.

2. A method according to claim 1, wherein the low signal is received at a Gunning Transceiver Logic receiver.

3. A method according to claim 1, wherein uncoupling the termination comprises:
    opening a switch disposed between the transmission line and the termination circuit.

4. A method comprising:
    detecting a low signal received from a transmission line;
    uncoupling a termination circuit from the transmission line in response to the detected low signal;
    detecting a transition of a strobe signal; and
    coupling the termination circuit to the transmission line in response to the detected transition.

5. A method according to claim 4, further comprising:
    after detecting the transition, waiting for a self-timed delay period,
    wherein the termination circuit is coupled to the transmission line after the waiting.

6. An apparatus comprising:
    a detector to detect a low signal received from a transmission line;
    a termination circuit to terminate the transmission line; and
    a device to uncouple the termination circuit from the transmission line in response to detection of the low signal;
    wherein an impedance of the termination circuit is substantially equal to an impedance of the transmission line.

7. An apparatus according to claim 6, wherein the apparatus comprises a Gunning Transceiver Logic receiver.

8. An apparatus according to claim 6, wherein the device comprises:
    a switch disposed between the transmission line and the termination circuit.

9. An apparatus comprising:
    a detector to detect a low signal received from a transmission line;
    a termination circuit to terminate the transmission line;
    a device to uncouple the termination circuit from the transmission line in response to detection of the low signal; and
    a second detector to detect a transition of a strobe signal,
    wherein the device is to couple the termination circuit to the transmission line in response to the detected transition.

10. An apparatus according to claim 9, further comprising:
    a delay element associated with a delay period,
    wherein the device is to couple the termination circuit to the transmission line after the delay period.

11. A system comprising:
    a microprocessor comprising:
        a detector to detect a low signal received from a transmission line;
        a termination circuit to terminate the transmission line; and
        a device to uncouple the termination circuit from the transmission line in response to detection of the low signal; and
    a memory controller coupled to the transmission line;
    wherein an impedance of the termination circuit is substantially equal to an impedance of the transmission line.

12. A system according to claim 11, wherein the device comprises:
    a switch disposed between the transmission line and the termination circuit.

13. A system comprising:
    a microprocessor comprising:
        a detector to detect a low signal received from a transmission line;
        a termination circuit to terminate the transmission line; and
        a device to uncouple the termination circuit from the transmission line in response to detection of the low signal;
    a memory controller coupled to the transmission line; and
    a second detector to detect a transition of a strobe signal,
    wherein the device is to couple the termination circuit to the transmission line in response to the detected transition.

14. A system according to claim 13, the microprocessor further comprising:
    a delay element associated with a delay period,
    wherein the device is to couple the termination circuit to the transmission line after the delay period.

15. A method comprising:
   detecting a low signal received from a transmission line; and
   uncoupling a termination circuit from the transmission line in response to the detected low signal;
   wherein uncoupling the termination comprises:
   creating an open circuit between the transmission line and the termination circuit.

* * * * *